(12) United States Patent
Hashigami et al.

(10) Patent No.: US 11,538,944 B2
(45) Date of Patent: Dec. 27, 2022

(54) SOLAR CELL, METHOD FOR MANUFACTURING SOLAR CELL, AND SOLAR CELL MODULE

(71) Applicant: SHIN-ETSU CHEMICAL CO., LTD., Tokyo (JP)

(72) Inventors: Hiroshi Hashigami, Annaka (JP); Takenori Watabe, Annaka (JP); Hiroyuki Otsuka, Annaka (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 31 days.

(21) Appl. No.: 16/014,691

(22) Filed: Jun. 21, 2018

(65) Prior Publication Data

US 2019/0140114 A1    May 9, 2019

Related U.S. Application Data

(62) Division of application No. 13/496,596, filed as application No. PCT/JP2010/058706 on May 24, 2010, now Pat. No. 10,032,940.

(30) Foreign Application Priority Data

Sep. 18, 2009 (JP) ................. 2009-217382

(51) Int. Cl.
*H01L 31/0216* (2014.01)
*H01L 31/0224* (2006.01)
(Continued)

(52) U.S. Cl.
CPC ............. *H01L 31/02167* (2013.01); *H01L 31/022425* (2013.01); *H01L 31/068* (2013.01);
(Continued)

(58) Field of Classification Search
CPC ................... H01L 31/068; H01L 31/1868
See application file for complete search history.

(56) References Cited

U.S. PATENT DOCUMENTS

| 5,661,041 A | 8/1997 | Kano |
| 2001/0029977 A1 | 10/2001 | Oya |

(Continued)

FOREIGN PATENT DOCUMENTS

| JP | 5-48123 A | 2/1993 |
| JP | 2004-193350 A | 7/2004 |

(Continued)

OTHER PUBLICATIONS

Jakschik, Thin Solid Films, 2003, vol. 425, pp. 216-220 (Year: 2003).*

(Continued)

*Primary Examiner* — Sadie White
(74) *Attorney, Agent, or Firm* — WHDA, LLP (57) ABSTRACT

A solar cell is provided with: a semiconductor substrate having a light-receiving surface and a non-light-receiving surface; a PN junction section formed on the semiconductor substrate; a passivation layer formed on the light-receiving surface and/or the non-light-receiving surface; and power extraction electrodes formed on the light-receiving surface and the non-light-receiving surface. The solar cell is characterized in that the passivation layer includes an aluminum oxide film having a thickness of 40 nm or less. As a result of forming a aluminum oxide film having a predetermined thickness on the surface of the substrate, it is possible to achieve excellent passivation performance and excellent electrical contact between silicon and the electrode by merely firing the conductive paste, which is conventional technology. Furthermore, an annealing step, which has been necessary to achieve the passivation effects of the aluminum (Continued)

oxide film in the past, can be eliminated, thus dramatically reducing costs.

18 Claims, 3 Drawing Sheets

(51) Int. Cl.
*H01L 31/068* (2012.01)
*H01L 31/18* (2006.01)

(52) U.S. Cl.
CPC ........ *H01L 31/1868* (2013.01); *Y02E 10/547* (2013.01); *Y02P 70/50* (2015.11)

(56) References Cited

U.S. PATENT DOCUMENTS

| | | | |
|---|---|---|---|
| 2003/0207540 A1* | 11/2003 | Ahn | H01L 21/28185 438/287 |
| 2004/0112426 A1* | 6/2004 | Hagino | H01L 31/022425 136/261 |
| 2004/0161872 A1 | 8/2004 | Gonsiorawski et al. | |
| 2005/0022863 A1* | 2/2005 | Agostinelli | H01L 31/02167 136/256 |
| 2006/0213548 A1* | 9/2006 | Bachrach | H01L 31/048 136/251 |
| 2007/0010061 A1 | 1/2007 | Forbes et al. | |
| 2007/0138659 A1 | 6/2007 | Konno | |
| 2007/0186970 A1* | 8/2007 | Takahashi | H01L 31/1868 136/255 |
| 2008/0072959 A1* | 3/2008 | Chen | H01L 31/022483 136/257 |
| 2009/0056798 A1* | 3/2009 | Merchant | H01L 31/1804 136/256 |
| 2009/0104461 A1 | 4/2009 | Young et al. | |
| 2009/0126786 A1* | 5/2009 | Dominguez | H01L 31/1804 136/256 |
| 2009/0165855 A1* | 7/2009 | Sun | H01L 31/02167 136/261 |
| 2009/0243111 A1 | 10/2009 | Ishikawa et al. | |
| 2010/0096014 A1 | 4/2010 | Iida et al. | |
| 2010/0108134 A1 | 5/2010 | Ravi | |
| 2010/0263725 A1 | 10/2010 | Schmidt | |
| 2010/0275984 A1 | 11/2010 | Kaes et al. | |
| 2011/0132444 A1 | 6/2011 | Meier et al. | |

FOREIGN PATENT DOCUMENTS

| | | |
|---|---|---|
| JP | 2005-311060 A | 11/2005 |
| JP | 2009-164544 A | 7/2009 |
| WO | 2006/129444 A1 | 12/2006 |
| WO | 2008/026415 A1 | 3/2008 |
| WO | 2008/078374 A1 | 7/2008 |
| WO | 2009/062882 A2 | 5/2009 |

OTHER PUBLICATIONS

J. Benick et al., "High efficiency n-type Si solar cells on Al2O3-passivated boron emitters", Applied Physics Letters, vol. 92, No. 25, Jun. 23, 2009, pp. 253504-1-253504-3.

Hoex et al., "Ultralow surface recombination of c-Si subsliales passivated by plasma-assisted atomic layer deposited Al2O3", Applied Physics Letters, vol. 89, No. 4, Jul. 24, 2006, pp. 042112-1-042112-3.

International Search Report of PCT/JP2010/058706, dated Jul. 13, 2010.

Duawe, S., et al., "Loss Mechanism In Silicon Nitride Rear Surface Passivation For Silicon Solar Cells," 17th European Phtovoltaic Solar Energy Conference, Oct. 22-26, 2001, pp. 339-342.

Russian Office Action dated Mar. 24, 2014, issued in corresponding Russian application No. 2012115464/28, w/English translation (9 pages).

Schmidt, J. et al., "Atomic-layer-deposited aluminum oxide for the surface passivation of high-efficiency silicon solar cells", 2008 33rd IEEE Photovoltaic Specialists Conference: PVSC: San Diego, California, USA, May 11-16, 2008, IEEE, Piscataway, NJ, vol. 33, May 11, 2008, pp. 1-5.

Extended (Supplementary) European Search Report dated Apr. 7, 2016, issued in counterpart European Patent Application No. 10816939.2. (9 pages).

Office Action dated Sep. 20, 2017, issued in counterpart Korean Application No. 10-2017-7018194, with English translation. (9 pages).

Schmidt, et al., Progress in Photovoltaics: Research and Applications, 2008, vol. 16, pp. 461-466.

Van Hemmen, Journal of the Electrochemical Society, 2007, vol. 154, pp. G165-G169.

Agostinelli, et al., Solar Energy Materials & Solar Cells 90 (2006) 3438-3443.

Non-Final Office Action dated Jan. 27, 2021, issued in U.S. Appl. No. 16/423,325, (17 pages).

Final Office Action dated Jul. 8, 2021, issued in U.S. Appl. No. 16/423,325 (29 pages).

\* cited by examiner

SOLAR CELL, METHOD FOR MANUFACTURING SOLAR CELL, AND SOLAR CELL MODULE

CROSS REFERENCE TO RELATED APPLICATIONS

This is a Divisional of U.S. application Ser. No. 13/496,596, filed Mar. 16, 2012, which is a 371 of PCT/JP2010/058706 filed May 24, 2010, which claims the benefit of foreign priority of Japanese Application No. 2009-217382 filed Sep. 18, 2009, the entire contents of which is incorporated herein by reference.

TECHNICAL FIELD

This invention relates to a solar cell featuring high productivity, low cost, and high efficiency, a method for manufacturing the solar cell, and a solar cell module.

BACKGROUND ART

Figure 1:
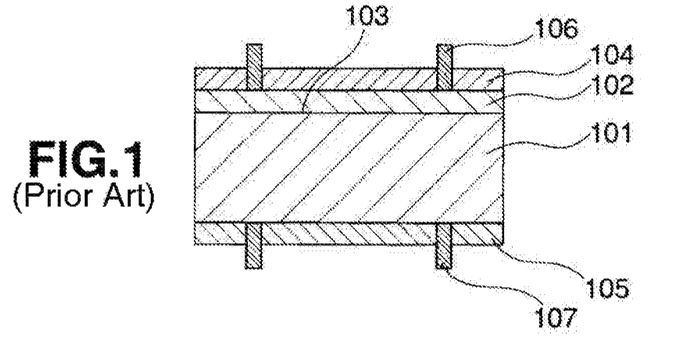
FIG. 1 is a cross-sectional view of an exemplary prior art solar cell structure.

FIG. 1 schematically illustrates a p-type substrate solar cell as one example of prior art solar cells which are generally manufactured on a mass-scale using single crystal and polycrystalline silicon substrates. A pn junction 103 is formed by diffusing Group V element such as phosphorus into the light-receiving surface of a semiconductor substrate (silicon substrate) 101 in a high concentration to form a n-type layer 102. Dielectric films 104 and 105 having a lower refractive index than silicon are formed on both the major surfaces (light-receiving and non-light-receiving surfaces) of p or n-type silicon substrate, respectively, for more efficient containment of light. In these dielectric films 104 and 105, titanium oxide, silicon nitride, silicon carbide, silicon oxide, tin oxide and the like are widely used. While the thickness of a dielectric film that provides for effective optical confinement varies with its refractive index, the thickness of a silicon nitride film, for example, is generally about 80 to 100 nm on the light-receiving surface and about 90 to 300 nm on the back surface.

Also, on the light-receiving surface and the non-light-receiving (back) surface, electrodes 106 and 107 are formed for extracting photo-created carriers. Among methods of forming such electrodes, one method which is widely used from the aspect of cost is by mixing metal fine particles such as silver or aluminum with an organic binder, printing the metal paste using a screen or the like, and heat treating the paste for bringing it in contact with the substrate. Electrode formation is generally preceded by formation of dielectric film. Thus, in order that the electrode make electrical contact with the silicon substrate, the dielectric film between the electrode and the silicon substrate must be removed. This is enabled by tailoring a glass component or additives in a metal paste so that the metal paste may penetrate through the dielectric films 104, 105 to make contact with the silicon substrate, known as the "fire-through" capability.

Another important function of dielectric films 104, 105 is to restrain carrier recombination on the silicon substrate surface. Silicon atoms within crystal are in a stable state due to a covalent bond between adjoining atoms. However, at the surface corresponding to the terminus of an atom array, an unstable energy level, also referred to as unsatisfied valence or dangling bond, develops because an adjoining atom to be bonded is not available. The dangling bond is electrically active enough to capture an electric charge photo-created within silicon whereby the charge is extinguished, thus detracting from the performance of solar cells. To suppress the performance loss, the solar cell is subjected to a certain surface terminating treatment for reducing the dangling bond. Alternatively, the antireflection coating is given electric charges for substantially reducing the concentration of electrons or holes at the surface for thereby restraining recombination of electrons with holes. In particular, the latter is referred to as "field effect passivation." Silicon nitride and analogous films are known to have positive charges and thus exert the field effect passivation.

However, it is known that if a silicon nitride or analogous film having positive charges is applied to the surface of p-type silicon substrate, solar cell performance is degraded. The positive charge in the film biases the energy band at the p-type silicon surface toward the inverted state, and the concentration of electrons or minority carriers becomes higher at the silicon surface. If an electrode is formed on the p-type silicon surface, then the electrons accumulating on the surface flow to the electrode. Since it is the electrode on the n-type silicon side that extracts electrons in the solar cell, the electrons flowing into the p-type silicon side electrode are lost as leak current flow from the solar cell output. For this reason, a silicon oxide film which allegedly has a relatively low positive charge and an aluminum oxide film having a negative charge are now used for the passivation of p-type silicon surface.

The following technical documents are considered to be relevant to the present invention.

PRIOR-ART DOCUMENTS

Non-Patent Document

Non-Patent Document 1: S. Dauwe, L. Mittelstadt, A. Metz and R. Hezel, Proc. the 17th European Photovoltaic Solar Energy Conference, p. 339, 2001

Non-Patent Document 2: J. Benik, B. Hoex, M. C. M. van de Sanden, W. M. M. Kessels, O. Schultz and S. W. Glunz, Applied Physics Letters, 92, 253504, 2008

SUMMARY OF INVENTION

Problem to be Solved by Invention

However, the aluminum oxide film has poor fire-through capability during electrode formation, as compared with the silicon nitride film and the like, so that the electric resistance between the electrode and the silicon substrate may be increased, failing to provide satisfactory solar cell characteristics. Then, when an electrode is formed on a silicon substrate having an aluminum oxide film formed thereon, the film must be configured to a pattern conformal to the electrode pattern. This pattern configuration is generally carried out by patterning using photolithography or acid resist, or by etching the film with acid. A technique of printing an etching paste and a patterning technique based on laser ablation are also included. These techniques, however, are scarcely acceptable in the commercial application from the standpoint of cost because not only the number of steps is increased, but also the materials and equipment involved are very expensive.

On the other hand, in order to maximize the passivation function of the aluminum oxide film, heat treatment around 400° C. is necessary. This further complicates the solar cell manufacturing process, becoming a barrier against cost reduction. Furthermore, common conductive pastes of high-temperature cure type are difficult to fire through the aluminum oxide film, resulting in increased electric resistance and restricting the solar cell characteristics.

An object of the present invention, which is devised in view of the above-discussed circumstances, is to provide a solar cell having good fire-through capability to an aluminum oxide film, high productivity, low cost, and high efficiency, a method of manufacturing the solar cell, and a solar cell module.

Means for Solving Problem

Making extensive investigations to attain the above object, the inventors have arrived at the invention which relates to a solar cell comprising a semiconductor substrate having a light-receiving surface and a non-light-receiving surface, a pn junction formed in the semiconductor substrate, a passivation layer disposed on the light-receiving surface and/or the non-light-receiving surface, and power extraction electrodes disposed on the light-receiving surface and the non-light-receiving surface. A layer including an aluminum oxide film having a thickness of up to 40 nm is formed as the passivation layer, which provides for a fire-through capability during electrode formation. A solar cell having satisfactory characteristics is thus obtainable.

Specifically, the present invention provides a solar cell, a method of manufacturing the same, and a solar cell module, as defined below.

Embodiment 1

A solar cell comprising a semiconductor substrate having a light-receiving surface and a non-light-receiving surface, a pn junction formed in the semiconductor substrate, a passivation layer disposed on the light-receiving surface and/or the non-light-receiving surface, and power extraction electrodes disposed on the light-receiving surface and the non-light-receiving surface, wherein
said passivation layer includes an aluminum oxide film having a thickness of up to 40 nm.

Embodiment 2

The solar cell of embodiment 1 wherein said passivation layer is disposed on the non-light-receiving surface of a p-type semiconductor substrate or the light-receiving surface of an n-type semiconductor substrate.

Embodiment 3

The solar cell of embodiments 1 or 2 wherein said passivation layer includes the aluminum oxide film and another dielectric film disposed thereon, the other dielectric film being formed of silicon oxide, titanium oxide, silicon carbide or tin oxide.

Embodiment 4

The solar cell of any one of embodiments 1 to 3 wherein said electrode is a sintered product obtained by firing a conductive paste, and the sintered product penetrates through the passivation layer including the aluminum oxide film so as to make electrical contact between the electrode and the substrate.

Embodiment 5

The solar cell of embodiment 4 wherein said sintered product contains an oxide of one or more elements selected from the group consisting of B, Na, Al, K, Ca, Si, V, Zn, Zr, Cd, Sn, Ba, Ta, Tl, Pb, and Bi.

Embodiment 6

The solar cell of embodiments 4 or 5 wherein said aluminum oxide film has a built-in negative electric charge which is increased by the firing step.

Embodiment 7

The solar cell of any one of embodiments 4 to 6 wherein a region of said aluminum oxide film which is to be disposed immediately below the electrode is displaced by the penetration of the sintered product, and said aluminum oxide film is present in at least a portion of the region excluding the region disposed immediately below the electrode.

Embodiment 8

A solar cell module comprising a plurality of electrically connected solar cells as set forth in any one of embodiments 1 to 7.

Embodiment 9

A method for manufacturing a solar cell, comprising the steps of forming a pn junction in a semiconductor substrate, forming a passivation layer on a light-receiving surface and/or a non-light-receiving surface of the semiconductor substrate, and forming power extraction electrodes on the light-receiving surface and the non-light-receiving surface,
wherein an aluminum oxide film having a thickness of up to 40 nm is formed as the passivation layer.

Embodiment 10

The method of embodiment 9 wherein the electrode is formed by firing a conductive paste at 500 to 900° C. for 1 second to 30 minutes to form a sintered product that penetrates through the passivation layer to make electrical contact between the electrode and the substrate.

Embodiment 11

The method of embodiment 10 wherein said sintered product contains an oxide of one or more elements selected from the group consisting of B, Na, Al, K, Ca, Si, V, Zn, Zr, Cd, Sn, Ba, Ta, Tl, Pb, and Bi.

Embodiment 12

The method of embodiment 10 or 11 wherein said aluminum oxide film has a built-in negative electric charge which is increased by the firing step.

Advantageous Effects of Invention

Now that an aluminum oxide film having a specific thickness is formed on a substrate surface, specifically the non-light-receiving surface of a p-type semiconductor substrate or the light-receiving surface of a n-type semiconductor substrate, a satisfactory passivation function and tight electrical contact between the substrate and the electrode are obtainable merely by the step of firing a conductive paste, which is a prior art technique. The invention omits the anneal step which is necessary in the prior art for the aluminum oxide film to exert a passivation effect, and is very effective for cost reduction.

EMBODIMENTS FOR CARRYING OUT INVENTION

Some embodiments of the solar cell of the invention are described below with reference to the drawings although the invention is not limited to these embodiments of the solar cell.

Figure 2:
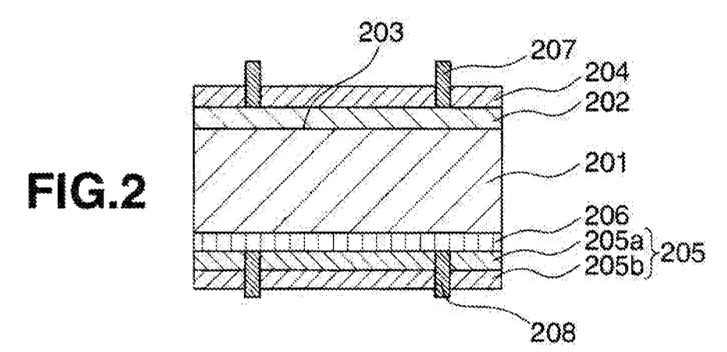
FIG. 2 is a cross-sectional view of one embodiment of the solar cell of the invention.
Figure 3:
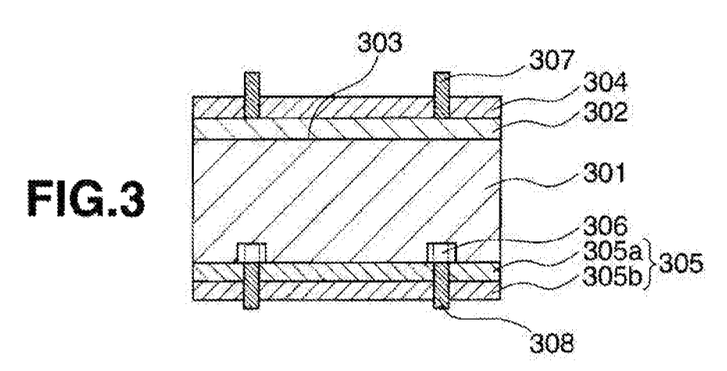
FIG. 3 is a cross-sectional view of another embodiment of the solar cell of the invention.

FIGS. 2 and 3 illustrate embodiments of the solar cell of the invention. A semiconductor substrate 201 (301) is etched with a concentrate alkaline solution of sodium hydroxide or potassium hydroxide in a concentration of 5 to 60 wt %, a mixed acid of hydrofluoric acid and nitric acid, or the like to remove saw damages on its surfaces. The semiconductor substrate used herein may be any of p or n-type single crystal silicon substrates, p or n-type polycrystalline silicon substrates, and p or n-type thin-film silicon substrates. The single crystal silicon substrate may be prepared by either the CZ method or the FZ method. For example, an as-cut single crystal {100} p-type silicon substrate in which high purity silicon is doped with Group III element such as B, Ga or In to give a resistivity of 0.1 to 5 □-cm may be used.

Next, the substrate surface (light-receiving surface) is formed with microscopic asperities known as "texture". Texturing is an effective means for reducing the reflectance of solar cells. The texture may be readily formed by immersing in a hot solution of alkali such as sodium hydroxide, potassium hydroxide, potassium carbonate, sodium carbonate, sodium hydrogen carbonate or tetramethylammonium hydroxide (concentration 1 to 10 wt %, temperature 60 to 100° C.) for about 10 to 30 minutes. Often, a predetermined amount of 2-propanol is dissolved in the solution to promote the reaction.

The texturing is followed by washing with an acidic aqueous solution such as hydrochloric acid, sulfuric acid, nitric acid, hydrofluoric acid or a mixture thereof. From the standpoints of cost and properties, washing in hydrochloric acid is preferred. To improve cleanness, washing may be performed by admixing 0.5 to 5 wt % of hydrogen peroxide in hydrochloric acid solution and heating at 60 to 90° C.

To form a back surface field (BSF) layer 206 (306) on the substrate, vapor phase diffusion of boron bromide or the like is carried out at 900 to 1,000° C. to form a p$^+$ layer. The BSF layer may be formed on the entire back surface (depicted at 206 in FIG. 2) or locally in conformation to a pattern of back surface electrode (depicted at 306 in FIG. 3).

In general silicon solar cells, the BSF layer should be formed only on the back surface. To this end, a suitable means is preferably taken for preventing the p$^+$ layer from being formed on the light-receiving surface, for example, by carrying out diffusion on a stack of two substrates, or by forming a diffusion barrier such as silicon nitride on the light-receiving surface. Since the BSF layer in which impurity is diffused in a high concentration has a high carrier concentration, the BSF layer is also effective for reducing the electric resistance between a back surface electrode 208 (308) and the substrate 201 (301).

Next, vapor phase diffusion of phosphorus oxychloride is carried out to form an n-type layer 202 (302) to define a pn junction 203 (303). Typically, the pn junction must be formed only on the light-receiving surface. To this end, a suitable means is preferably taken for preventing phosphorus from diffusing into the back surface, for example, by carrying out diffusion on a stack of two substrates with the p$^+$ layer sides mated, or by forming a diffusion barrier such as silicon nitride on the back surface. After diffusion, any glass deposit on the surface is removed with hydrofluoric acid or the like. Besides the vapor phase diffusion, this step may be performed by another technique of spin coating, spraying or otherwise applying a diffusing agent.

Next, a dielectric film 204 (304) is formed which serves as an antireflective film on the substrate surface or light-receiving surface. As the dielectric film, for example, silicon nitride is deposited to a thickness of about 50 to 100 nm. For deposition, a chemical vapor deposition (abbreviated as CVD, hereinafter) system is used. A mixture of monosilane ($SiH_4$) and ammonia ($NH_3$) is often used as the reactant gas. In some cases, nitrogen may be used instead of $NH_3$. The desired refractive index may be accomplished by diluting the depositing species, adjusting the process pressure, and diluting the reactant gas, with $H_2$ gas. The dielectric film is not limited to a silicon nitride film, and a film of silicon oxide, silicon carbide or titanium oxide which is formed by heat treatment, atomic layer deposition (abbreviated as ALD, hereinafter) or the like may be used instead.

On the other hand, a passivation film or layer 205 (305) including an aluminum oxide film 205a (305a) is formed on the back surface or p-type silicon surface. While the CVD or ALD method is often used for the deposition of aluminum oxide film, vacuum evaporation or sputtering may also be used herein. The CVD and ALD methods typically use trimethylaluminum (TMA) as the reactant, and hydrogen ($H_2$) or argon (Ar) as the carrier gas. Oxygen ($O_2$), carbon dioxide ($CO_2$), water ($H_2O$), ozone ($O_3$) or the like is used as the oxidizing agent for aluminum. One exemplary reaction scheme is as follows.

$$Al(CH_3)_3 + 1.5H_2O \rightarrow 0.5Al_2O_3 + 3CH_4$$

Film deposition by the CVD method proceeds while these molecules are decomposed and deposited on the substrate. This decomposition may be thermally induced at 100 to 400° C. by heating the substrate, or electromagnetically induced at 100 to 400° C. by applying a high-frequency electric field. A crystalline or amorphous film having any arbitrary constitutional ratio of aluminum to oxygen may be formed.

The aluminum oxide film thus obtained bears a negative electric charge, which is believed to be derived from the following chemical reaction scheme. Herein, for simplicity sake, reference is made to reaction in $Al_2O_3$ film.

$$2Al_2O_3 \rightarrow 3(AlO_{4/2})^{1-} + Al^{3+}$$

The film is electrically neutral as such. As $Al^{3+}$ combines with oxygen in the aluminum oxide film to form a donor/acceptor pair, by which the positive charge is extinct, the film eventually bears a negative charge.

It is believed that the negative charge-generating mechanism described above is equally applicable to other systems such as an aluminum oxide film deviating from the stoichiometry, i.e., of $Al_{1-x}O_x$ wherein x is an arbitrary constant, or a mixture of aluminum oxide with hydrogen, carbon, nitrogen or the like. Namely, a negative charge may be generated when the chemical scheme stands between Al and O, at least in part, in a system where Al and O are co-present.

Continuing empirical studies on the thickness of aluminum oxide film, the inventors have found that the film thickness is up to 40 nm, preferably up to 30 nm, and more preferably up to 20 nm. Although the lower limit is not critical, the film thickness is typically at least 1 nm to provide uniform coverage over the substrate surface.

To further enhance the optical confinement effect at the back surface, another dielectric film 205b (305b) may be formed on the aluminum oxide film 205a (305a) as an overlay. For the dielectric film 205b (305b), it is preferable from the optical aspect to use silicon oxide (SiO, $SiO_2$), but also acceptable to use titanium oxide (TiO, $TiO_2$), silicon carbide (SiC), tin oxide (SnO, $SnO_2$, $SnO_3$) or the like. The dielectric film 205b (305b) on the back surface preferably has a thickness of 50 to 250 nm, more preferably 100 to 200 nm. If the film is too thin or thick, the optical confinement effect may become insufficient.

Next, electrodes 207 and 208 (307 and 308) are formed on the light-receiving surface and the non-light-receiving surface (back surface) of the substrate, respectively. The electrodes are formed by printing a conductive paste, typically a silver paste obtained by mixing a silver powder and glass frit with an organic binder, on the light-receiving surface and the back surface, and firing the paste at a temperature of about 500 to 900° C., preferably about 700 to 850° C., for 1 second to 30 minutes, preferably 3 seconds to 15 minutes. The heat treatment causes the passivation film to be attacked by the conductive paste, typically silver paste, whereby the electrode in the form of a sintered product of the conductive paste fires or penetrates through the passivation film to make electrical contact with the silicon substrate. Notably, firing of the electrodes on the light-receiving surface and the back surface may be carried out separately on each surface.

It is the metal oxide in the conductive paste that provides the conductive paste with a passivation film fire-through capability. The metal oxide used herein may be an oxide of one or more elements selected from the group consisting of B, Na, Al, K, Ca, Si, V, Zn, Zr, Cd, Sn, Ba, Ta, Tl, Pb, and Bi. In order that firing cause the paste to penetrate through the aluminum oxide film and optional dielectric film to make good contact with the substrate, glass materials such as B—Pb—O, B—Pb—Zn—O, B—Zn—V—O, B—Si—Pb—O, B—Si—Pb—Al—O, B—Si—Bi—Pb—O, and B—Si—Zn—O base materials may be used.

A region of the aluminum oxide film which is to be disposed immediately below the electrode is displaced by the penetration of the sintered product, and the aluminum oxide film is formed in at least a portion of the region excluding the region disposed immediately below the electrode. For gaining a satisfactory passivation effect, the aluminum oxide film is preferably formed on the entire non-light-receiving surface (back surface) and/or the entire light-receiving surface excluding the region disposed immediately below the electrode, specifically on the entire non-light-receiving surface of p-type silicon substrate or the entire light-receiving surface of n-type silicon substrate.

Figure 4:
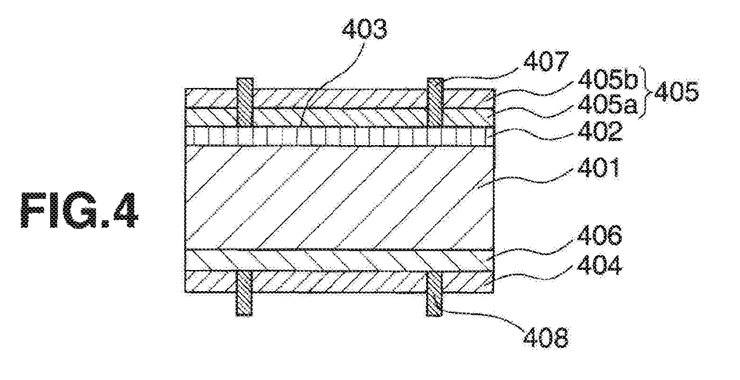
FIG. 4 is a cross-sectional view of a further embodiment of the solar cell of the invention.
Figure 5:
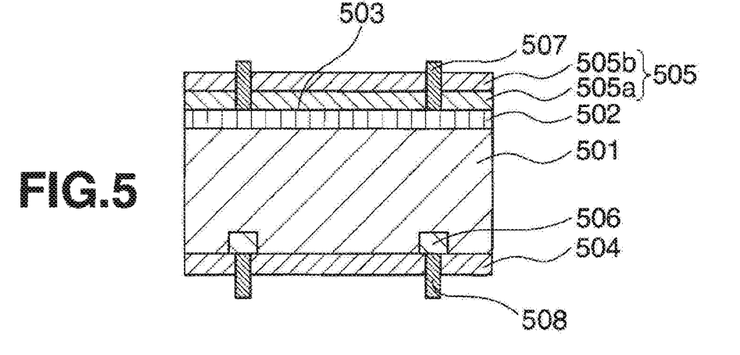
FIG. 5 is a cross-sectional view of a still further embodiment of the solar cell of the invention.

Although the embodiments of the solar cell using a p-type silicon substrate have been described, the invention is applicable to a solar cell using an n-type silicon substrate. As shown in FIGS. 4 and 5, an n-type silicon substrate 401 (501) is prepared by doping high-purity silicon with Group V element such as P, As or Sb, and typically adjusted to a resistivity of 0.1 to 5 □-cm. The n-type silicon solar cell may be manufactured by the same method as the p-type silicon solar cell, except that it is essential to form a $p^+$ layer 402 (502) in order to form a pn junction 403 (503). On the other hand, an $n^+$ layer for forming a BSF layer on the back surface may be formed on the entire back surface (depicted at 406 in FIG. 4) or formed locally in conformation to a pattern of back surface electrode (depicted at 506 in FIG. 5).

The light-receiving surface may be passivated by forming an aluminum oxide film 405a (505a) on the surface of a p+ layer 402 (502) according to the invention, and forming another dielectric film 405b (505b), typically a dielectric film of silicon oxide (SiO, $SiO_2$), titanium oxide (TiO, $TiO_2$), silicon carbide (SiC) or tin oxide (SnO, $SnO_2$, $SnO_3$) thereon as an overlay. On the n layer on the back surface, a dielectric film 404 (504) of silicon nitride, silicon oxide, silicon carbide, titanium oxide or the like is preferably formed. The film forming conditions including film thickness and the conditions for forming electrodes 407 and 408 (507 and 508) may be the same as those for the p-type silicon substrate.

On the solar cell back surface, a reflector is preferably provided for reflecting back the light transmitted by the substrate. As the reflector, aluminum or silver which can be formed as a film by vacuum evaporation or the like may be used. Equivalent effect may be achieved, without additional treatment, merely by applying a white back sheet to a solar cell module. On the other hand, the reflector may be omitted, and electricity can be generated by causing scattering light enter the back surface. Furthermore, electricity can be generated by setting the solar cell such that the back surface may become the light-receiving surface side.

According to the invention, a solar cell module is obtained by electrically connecting a plurality of solar cells manufactured as above.

EXAMPLE

Experiments, Examples and Comparative Examples are given below for further illustrating the invention although the invention is not limited to the Examples.

Experiment 1
Investigation of Electrode Contact Resistance

To investigate the thickness of an aluminum oxide film, first a conductive paste commonly used for the fire-through capability to silicon oxide film was used to examine its fire-through capability to aluminum oxide film. The fire-through capability can be evaluated in terms of contact resistance between the electrode and the silicon substrate.

Vapor phase diffusion of boron bromide was carried out on a textured p-type silicon wafer of 15 cm squares having a thickness of 240 □m, thereby diffusing boron therein to form a $p^+$ layer. An aluminum oxide film was formed on the $p^+$ layer by the ALD method, and a silicon oxide film was formed thereon by the plasma CVD method. The thickness of the silicon oxide film was adjusted such that the total thickness of aluminum oxide film and silicon oxide film was 100 nm. On these passivation films, a commercially available fire-through capability silver paste was printed in a comb-shaped pattern, and fired in a rapid thermal processing (RTP) furnace at a peak temperature of 800° C. for 3 seconds. The number of samples prepared was 5 samples for each set of conditions.

To evaluate contact resistance by the ladder method, strip-shaped specimens of 1 cm wide and 5 cm long were cut out of a wafer at 5 positions and measured.

Figure 6:
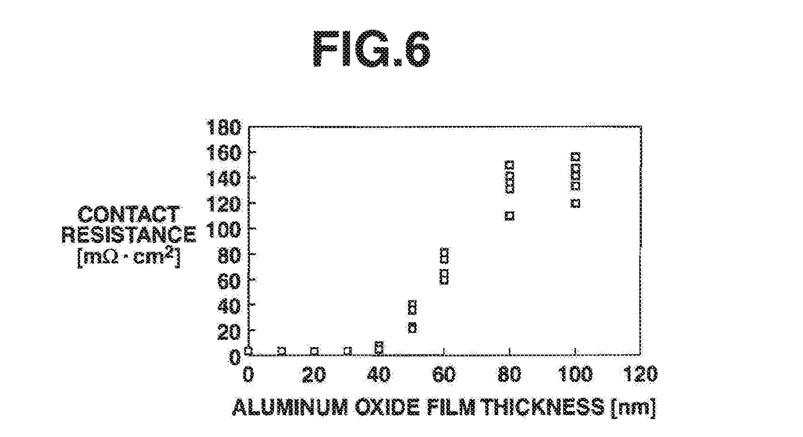
FIG. 6 is a graph showing contact resistance versus thickness of aluminum oxide film.

FIG. 6 diagrammatically illustrates contact resistance versus thickness of aluminum oxide film. For the combination of silicon oxide film and aluminum oxide film, when the aluminum oxide film thickness is reduced to about 40 nm, the contact resistance shows a drastic drop, and when the aluminum oxide film thickness is reduced to 20 nm or less, the contact resistance reaches a value approximate to that of silicon oxide film of 100 nm thick (aluminum oxide film thickness=0 nm). From these results, the aluminum oxide film thickness that provides for satisfactory electrical contact is judged to be 40 nm or less, preferably 30 nm or less, and more preferably 20 nm or less.

Experiment 2
Investigation of Passivation Effect Upon Electrode Firing

Next, a test of measuring carrier life was carried out to examine the passivation effect versus thickness of aluminum oxide film.

On opposite surfaces of a p-type silicon wafer of 15 cm square having a thickness of 200 μm which had been mirror finished by acid etching, aluminum oxide films of varying thickness were formed by the ALD method. To impart the thermal hysteresis of electrode firing heat treatment, each sample was heat treated in a RTP furnace at a peak temperature of 800° C. for 3 seconds.

Figure 7:
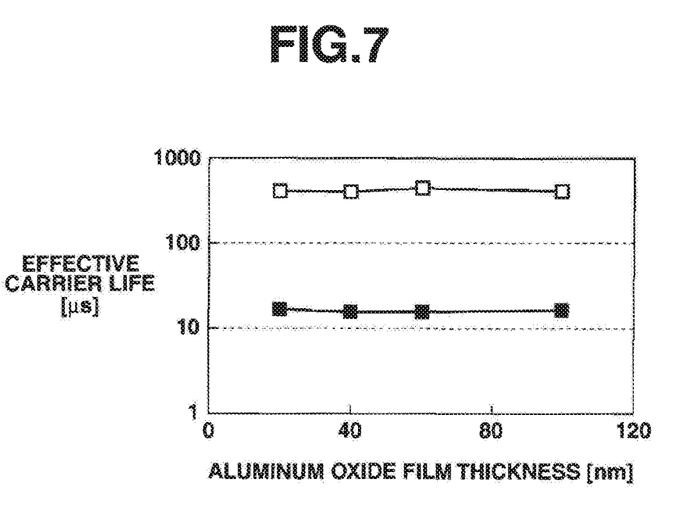
FIG. 7 is a graph showing effective carrier life before and after heat treatment.

FIG. 7 diagrammatically illustrates the measurement results of effective carrier life before and after heat treatment. The effective carrier life is an overall carrier life including a carrier life in crystal bulk silicon and a carrier life at the silicon-aluminum oxide film interface, expressed in microsecond unit. In FIG. 7, the broken line with black squares designates the effective carrier life before heat treatment and the broken line with white squares designates the effective carrier life after heat treatment.

For all the samples, a phenomenon that the carrier life was extended by heat treatment was observed, and the results indicated that the value of carrier life does not depend on the thickness of aluminum oxide film. It was confirmed by CV measurement that the extension of the carrier life by heat treatment is attributable to an increase of built-in negative charge quantity in aluminum oxide film by heat treatment. The charge quantity before heat treatment was $1 \times 10^{10}$ to $3 \times 10^{10}$ C-cm$^{-2}$ whereas the charge quantity after heat treatment increased to about $3 \times 10^{12}$ C-cm$^{-2}$ for all varying thickness samples. Based on the fact that the passivation effect of aluminum oxide film does not depend on its thickness, it is believed that charges within the film collect near the interface between silicon substrate and aluminum oxide film.

It is evident from these results that satisfactory passivation effect is achievable even when the thickness of aluminum oxide film is reduced to 40 nm or less. It has been newly found that a high negative charge quantity of aluminum oxide film is fully developed by brief heat treatment during electrode firing, and the low-temperature anneal step which has been a problem can be omitted.

Example 1

One hundred (100) as-cut, boron-doped, {100} p-type silicon substrates having a thickness of 250 μm and a resistivity of 1 Ω-cm were treated with a hot conc. potassium hydroxide aqueous solution for saw damage removal, immersed in a potassium hydroxide/2-propanol aqueous solution for texturing, and subsequently washed with a hydrochloric acid/hydrogen peroxide mixed solution. Next, a stack of substrates with their light-receiving surfaces mated was heat treated at 1000° C. in a boron bromide atmosphere to form a p$^+$ layer. Subsequently, a stack of substrates with their back surfaces mated was heat treated at 850° C. in a phosphorus oxychloride atmosphere to form a pn junction. After diffusion, the glass layer was removed with hydrofluoric acid, and the substrates were washed with deionized water and dried. After these treatments, a silicon nitride film of 100 nm thick was deposited as an antireflective film on the entire light-receiving surface in a plasma CVD system.

On half (50 substrates) of the thus treated substrates, a back side passivation film was formed. On these 50 substrates, an aluminum oxide film of 20 nm thick was deposited on the entire back surface at a substrate temperature of 200° C. in an ALD system, using TMA as the reactant gas and oxygen as the oxidizing agent. The aluminum oxide film resulting from this process was stoichiometric amorphous $Al_2O_3$. Thereafter, a silicon oxide film of 150 nm was deposited in a sputtering system.

Next, Ag paste was screen printed in a comb-shaped pattern on the light-receiving surface and back surface of all the substrates and dried. Then the paste was fired in air at 800° C. for 3 seconds whereby Ag electrodes penetrated through the dielectric films on both the light-receiving surface and the back surface to make electric conduction to the silicon substrate. In a vacuum evaporation system, an Al film of 2 μm thick was formed as a reflector on the back side of the solar cell.

Comparative Example 1

The remaining 50 substrates prepared in Example 1 were processed as in Example 1 except that a silicon nitride film of 100 nm thick was deposited on the back surface by the same method as applied to the substrate light-receiving surface in Example 1.

The solar cells in Example 1 and Comparative Example 1 were measured for characteristics by a current-voltage tester using simulator solar light with air mass 1.5. The results are reported in Table 1, indicating that the performance of solar cells in Example 1 as the practice of the invention is superior to the performance of solar cells in Comparative Example 1.

TABLE 1

| | Dielectric film on non-light-receiving surface | Short-circuit current, mA/cm$^2$ | Open-circuit voltage, V | Fill factor, % | Conversion efficiency, % |
|---|---|---|---|---|---|
| Example 1 | Al$_2$O$_3$ 20 nm + SiO$_2$ 150 nm | 37.8 | 0.641 | 78.4 | 19.0 |
| Comparative Example 1 | SiN 100 nm | 36.0 | 0.636 | 77.5 | 17.7 |

In Example 1 within the scope of the invention, satisfactory electric contact is obtainable even though the thickness of dielectric film on the back surface is greater than that of Comparative Example 1. In addition, since the leak current is eliminated due to the absence of an inversion layer, a satisfactory fill factor is obtained, and both the open-circuit voltage and short-circuit current are significantly improved.

Example 2

One hundred (100) as-cut, phosphorus-doped, {100} n-type silicon substrates having a thickness of 250 □m and a resistivity of 1 □-cm were treated with a hot conc. potassium hydroxide aqueous solution for saw damage removal, immersed in a potassium hydroxide/2-propanol aqueous solution for texturing, and subsequently washed with a hydrochloric acid/hydrogen peroxide mixed solution. Next, a stack of substrates with their back surfaces mated was heat treated at 1000° C. in a boron bromide atmosphere to form a pn junction. Subsequently, a stack of substrates with their light-receiving surfaces mated was heat treated at 850° C. in a phosphorus oxychloride atmosphere to form a BSF layer. After diffusion, the glass layer was removed with hydrofluoric acid, and the substrates were washed with deionized water and dried. After these treatments, a silicon nitride film of 100 nm thick was deposited as a back side dielectric film on the entire back surface in a plasma CVD system.

On half (50 substrates) of the thus treated substrates, a light-receiving surface passivation film was formed. On these 50 substrates, an aluminum oxide film of 20 nm thick was deposited on the entire light-receiving surface at a substrate temperature of 200° C. in an ALD system, using TMA as the reactant gas and oxygen as the oxidizing agent. The aluminum oxide film resulting from this process was stoichiometric amorphous $Al_2O_3$. Thereafter, a titanium oxide film of 50 nm was deposited by the atmospheric CVD method.

Next, Ag paste was screen printed in a comb-shaped pattern on the light-receiving surface and back surface of all the substrates and dried. Then the paste was fired in air at 800° C. for 3 seconds whereby Ag electrodes penetrated through the dielectric films on both the light-receiving surface and the back surface to make electric conduction to the silicon substrate. In a vacuum evaporation system, an Al film of 2 □m thick was formed as a reflector on the back side of the solar cell.

Comparative Example 2

The remaining 50 substrates prepared in Example 2 were processed as in Example 2 except that a silicon nitride film of 100 nm thick was deposited on the light-receiving surface by the same method as applied to the substrate back surface in Example 2.

The solar cells in Example 2 and Comparative Example 2 were measured for characteristics by a current-voltage tester using simulator solar light with air mass 1.5. The results are reported in Table 2, indicating that the performance of solar cells in Example 2 as the practice of the invention is superior to the performance of solar cells in Comparative Example 2.

TABLE 2

| | Dielectric film on light-receiving | Short-circuit current, mA/cm² | Open-circuit voltage, V | Fill factor, % | Conversion efficiency, % |
|---|---|---|---|---|---|
| Example 2 | Al₂O₃ 20 nm + TiO 50 nm | 36.5 | 0.651 | 78.8 | 18.7 |
| Comparative Example 2 | SiN 100 nm | 36.2 | 0.637 | 78.0 | 18.0 |

DESCRIPTION OF REFERENCE NUMERALS 101, 201, 301, 401, 501: semiconductor substrate
102, 202, 302: n-type layer
402, 502: p-type layer
103, 203, 303, 403, 503: pn junction
104, 105, 204, 304, 404, 504: dielectric film
205, 305, 405, 505: passivation film
205a, 305a, 405a, 505a: aluminum oxide film
205b, 305b, 405b, 505b: dielectric film
206, 306, 406, 506: back surface field (BSF) layer
106, 207, 307, 407, 507: light-receiving surface electrode
107, 208, 308, 408, 508: back surface electrode

The invention claimed is:

1. A solar cell comprising:
a semiconductor substrate of a p type or an n-type having a light receiving surface on one end thereof and a non-light receiving surface on the other end thereof, the substrate having a pn junction in a light receiving side;
a first passivation layer formed on one of the light receiving surface and the non-light receiving surface, the first passivation layer comprising an aluminum oxide amorphous film and another dielectric film formed on the aluminum oxide amorphous film, a material of the another dielectric film being different from aluminum oxide, wherein the aluminum oxide amorphous film has a thickness of up to 20 nm and is in contact with the surface of a p type surface in the non-light receiving surface or the light receiving surface;
a second passivation layer made of a dielectric film a material of which is different from aluminum oxide being formed on an n type surface where no first passivation layer is formed; and
first and second extraction electrodes of fired products of a conductive paste coated on the surfaces of the first passivation layer and the second passivation layer, respectively, wherein at least one of the first and second extraction electrodes comprises metal powder and glass frit, and the first and second extraction electrodes penetrate through the first and second passivation layers respectively, to make an electrical contact between the electrodes and both of the p type surface and the n type surface.

2. The solar cell according to claim 1, which further comprises a reflector formed on the first passivation layer on the non-light receiving surface of the substrate.

3. The solar cell according to claim 1, wherein the p type surface in direct contact with the first passivation layer is provided with a back surface field layer to which the first extraction electrode on the non-light receiving surface is electrically connected, the back surface field layer having the same conductivity type as the substrate.

4. The solar cell according to claim 1, wherein the n type surface in contact with the second passivation layer is provided with a back surface field layer to which the second extraction electrode on the non-light receiving surface is electrically connected, the back surface field layer having the same conductivity type as the substrate.

5. The solar cell according to claim 1, wherein the substrate has a back surface field layer of the p type or n type in the non-light receiving surface.

6. The solar cell according to claim 5, wherein the back surface field layer is partially formed in the non-light receiving surface.

7. The solar cell according to claim 1, wherein the another dielectric film is free from aluminum oxide.

8. A solar cell comprising:
a semiconductor substrate of a p type or an n type having a p type or an n type light receiving surface on one end thereof and a p type or an n type non-light receiving surface on the other end thereof, the substrate having a pn junction in a light receiving side;
a first passivation layer comprising an aluminum oxide amorphous film and a dielectric film, the aluminum oxide amorphous film being in contact with the p type surface and having a thickness of up to 20 nm, wherein the dielectric film is formed on the aluminum oxide amorphous film and has a thickness of 50 to 250 nm;
a second passivation layer of a dielectric film, a material of which is different from aluminum oxide formed on the n type surface of the substrate; and
fired products of a conductive paste coated on the respective dielectric films of the first and second passivation layers so as to make an electric contact between the fired products and both of the p type and the n type surfaces, wherein the substrate has a back surface field layer of the p type or the n type in the non-light receiving surface, and at least one of the fired products comprises metal powder and glass frit.

9. The solar cell according to claim 8, wherein the back surface field layer is constituted by a plurality of back surface field layers of the p type or the n type in the non-light receiving surface, and each of the back surface field layers extends only in a portion of the surface in the non-light receiving surface.

10. A solar cell comprising:
a semiconductor substrate of a p type having a light receiving surface on one end thereof and a non-light receiving surface on the other end thereof, the substrate having a pn junction in a light receiving side;
a first passivation layer formed on the non-light receiving surface, the first passivation layer comprising an aluminum oxide amorphous film and another dielectric film formed on the aluminum oxide amorphous film, a material of the another dielectric film being different from aluminum oxide, wherein the aluminum oxide amorphous film has a thickness of up to 20 nm and is in contact with the surface of a p type surface in the non-light receiving surface;
a second passivation layer made of a dielectric film a material of which is different from aluminum oxide being formed on an n type surface in the light receiving surface;
a first extraction electrode of a fired product of a conductive paste coated on the surface of the first passivation layer;
a second extraction electrode of a fired product of a conductive paste coated on the surface of the second passivation layer;
at least one of the first and second extraction electrodes comprising metal powder and glass frit, and
a back surface field layer of p+ type being formed in the entire surface of the non-light receiving surface;
wherein the first extraction electrode penetrates through the first passivation layer to make an electrical contact between the first extraction electrode and the back surface field layer in the non-light receiving surface and the second extraction electrode penetrates through the second passivation layer to make an electrical contact between the second extraction electrode and the n type surface in the light receiving surface.

11. A solar cell comprising:
a semiconductor substrate of an n type having a light receiving surface on one end thereof and a non-light receiving surface on the other end thereof, the substrate having a pn junction in a light receiving side, wherein the pn junction is formed on the n-type layer;
a first passivation layer formed on the light receiving surface, the first passivation layer comprising an aluminum oxide amorphous film and another dielectric film formed on the aluminum oxide amorphous film, a material of the another dielectric film being different from aluminum oxide, wherein the aluminum oxide amorphous film has a thickness of up to 20 nm and is in contact with the surface of a p+-type surface on the n-type layer of the substrate in the light receiving surface;
a second passivation layer made of a dielectric film a material of which is different from aluminum oxide being formed on the n-type surface in the non-light receiving surface;
a first extraction electrode of a fired product of a conductive paste coated on the surface of the first passivation layer;
a second extraction electrode of the fired product of the conductive paste coated on the surface of the second passivation layer;
at least one of the first and second extraction electrodes comprising metal powder and glass frit, and
a back surface field layer of n+ type being formed in the entire non-light receiving surface;
wherein the first extraction electrode penetrates through the first passivation layer to make an electrical contact between the first extraction electrode and the p+ type surface of the pn-junction and the second extraction electrode penetrates through the second passivation layer to make an electrical contact between the second extraction electrode and the n+ type surface in the non-light receiving surface.

12. A solar cell comprising:
a semiconductor substrate of a p type having a light receiving surface on one end thereof and a non-light receiving surface on the other end thereof, the substrate having a pn junction in a light receiving side, wherein the pn junction is formed on the p-type layer;
a first passivation layer formed on the non-light receiving surface, the first passivation layer comprising an aluminum oxide amorphous film and another dielectric film formed on the aluminum oxide amorphous film, a material of the another dielectric film being different from aluminum oxide, wherein the aluminum oxide amorphous film has a thickness of up to 20 nm and is in contact with the surface of the p-type surface of the substrate in the non-light receiving surface;
a second passivation layer made of a dielectric film a material of which is different from aluminum oxide being formed on the n type surface of the pn junction in the light receiving surface;
a first extraction electrode of a fired product of a conductive paste coated on the surface of the first passivation layer;
a second extraction electrode of the fired product of the conductive paste coated on the surface of the second passivation layer;
at least one of the first and second extraction electrodes comprising metal powder and glass frit, and
a plurality of back surface field layers of p+ type formed in the entire non-light receiving surface, each of the back surface field layers extending only in a portion of the surface in the non-light receiving surface;

wherein the second extraction electrode penetrates through the second passivation layer to make an electrical contact between the second extraction electrode and the n type surface of the pn junction and the first extraction electrode penetrates through the first passivation layer to make an electrical contact between the first extraction electrode and the p+ type surface in the non-light receiving surface.

13. A solar cell comprising:
a semiconductor substrate doped with gallium having a light receiving surface on one end thereof and a non-light receiving surface on the other end thereof, the substrate having a pn junction in a light receiving side;
a first passivation layer formed on the non-light receiving surface, the first passivation layer comprising an aluminum oxide amorphous film and another dielectric film formed on the aluminum oxide amorphous film, a material of the another dielectric film being different from aluminum oxide, wherein the aluminum oxide amorphous film has a thickness of up to 20 nm and is in contact with the surface of the semiconductor substrate;
a second passivation layer made of a dielectric film, a material of which is different from aluminum oxide and is formed on an n+ type surface in the light receiving surface;
a plurality of back surface field layers of p+ type being formed in the non-light receiving surface;
a first extraction electrode of a fired product of a conductive paste coated on the surface of the first passivation layer; and
a second extraction electrode of a fired product of a conductive paste coated on the surface of the second passivation layer;
at least one of the first and second extraction electrodes comprising metal powder and glass frit, and
wherein the first extraction electrode penetrates through the first passivation layer to make an electrical contact between the first extraction electrode and the plurality of p+ type back surface field layers; and the second extraction electrode penetrates through the second passivation layer to make an electrical contact between the second extraction electrode and the n type layer in the light receiving surface.

14. A solar cell module comprising a plurality of solar cells set forth in claim 1, wherein a plurality of the solar cells is electrically connected.

15. The solar cell according to claim 1, wherein the aluminum oxide amorphous film is an atomic layer deposition (ALD) film.

16. A solar cell comprising:
a p-type semiconductor substrate doped with Ga, B or In, the substrate having an n-type layer on a light-receiving surface side;
a first extraction electrode provided on the light-receiving surface side of the substrate in the contact with the light-receiving surface of the substrate; and
a second extraction electrode in contact with a non-light-receiving surface of the substrate;
at least one of the first and second extraction electrodes being a fired product of a conductive paste containing metal powder and glass frit,
wherein a passivation layer of aluminum oxide amorphous film having a thickness of 1 to 20 nm is formed on a p-type surface in the non-light-receiving surface, the aluminum oxide amorphous film is in contact with the p type surface of the substrate in the non-light receiving surface, said second extraction electrode penetrates through the passivation layer to make an electrical contact with the p-type surface of the substrate, a built-in negative charge quantity in the passivation layer in the state of the fired product is an order of $10^{12}$ (C/cm$^2$), and the conversion efficiency of the solar cell is about 19%.

17. The solar cell according to claim 16, wherein the built-in negative charge quantity (C/cm$^2$) in the passivation layer has increased from the value on the order of $10^{10}$ in the state of the passivation layer as formed to the value on the order of $10^{12}$ in the state of the fired product.

18. A solar cell comprising:
an n-type semiconductor substrate doped with P, As or Sb, the substrate having a p-type layer on a light-receiving surface side;
a first extraction electrode in contact with the light-receiving surface of the substrate, which is a fired product of a conductive paste containing metal powder and glass frit; and
a second extraction electrode provided on a non-light-receiving surface side of the substrate in the contact with the non-light-receiving surface of the substrate;
wherein a passivation layer of aluminum oxide amorphous film having a thickness of 1 to 20 nm is formed on the p-type surface in the light-receiving surface, the aluminum oxide amorphous film is in contact with the p type surface of the substrate in the light receiving surface, said first extraction electrode penetrates through the passivation layer to make an electrical contact with the p-type surface of the substrate, a built-in negative charge quantity in the passivation layer in the state of the fired product is an order of $10^{12}$ (C/cm$^2$) and the conversion efficiency of the solar cell is about 19%.

* * * * *